United States Patent [19]

Grünberg

[11] Patent Number: 4,949,039

[45] Date of Patent: Aug. 14, 1990

[54] MAGNETIC FIELD SENSOR WITH FERROMAGNETIC THIN LAYERS HAVING MAGNETICALLY ANTIPARALLEL POLARIZED COMPONENTS

[75] Inventor: Peter Grünberg, Jülich, Fed. Rep. of Germany

[73] Assignee: Kernforschungsanlage Jülich GmbH, Jülich, Fed. Rep. of Germany

[21] Appl. No.: 365,938

[22] Filed: Jun. 14, 1989

[30] Foreign Application Priority Data

Jun. 16, 1988 [DE] Fed. Rep. of Germany ....... 3820475

[51] Int. Cl.⁵ ............. G01R 33/06; G11B 5/39; H01L 43/00
[52] U.S. Cl. ............................ 324/252; 338/32 H; 360/113
[58] Field of Search ............ 324/251, 252; 338/32 R; 360/113; 365/158

[56] References Cited

U.S. PATENT DOCUMENTS

| | | | |
|---|---|---|---|
| 3,860,965 | 1/1975 | Voegeli | 360/113 |
| 4,356,523 | 10/1982 | Yeh | 360/113 |
| 4,686,472 | 8/1987 | Van Ooijen et al. | 324/252 |
| 4,755,897 | 7/1988 | Howard | 360/113 |
| 4,809,109 | 2/1989 | Howard et al. | 360/113 |

Primary Examiner—Gerard R. Strecker
Attorney, Agent, or Firm—Herbert Dubno

[57] ABSTRACT

A magnetic field sensor comprises a stack of ferromagnetic layers advantageously separated by an intermediate layer of proper material and so arranged that the ferromagnetic layers are with one component in an antiparallel magnetization direction. The sensor is provided with terminals for passing an electric current through the stack and for detecting a voltage drop across the stack. The magnetic resistance change with such a stack is substantially greater than in systems which do not provide an antiparallel magnetization or do not have the intermediate layer.

12 Claims, 2 Drawing Sheets

MAGNETIC FIELD SENSOR WITH FERROMAGNETIC THIN LAYERS HAVING MAGNETICALLY ANTIPARALLEL POLARIZED COMPONENTS

FIELD OF THE INVENTION

My present invention relates to a magnetic field sensor with ferromagnetic thin layers and, more particularly, to a sensor having a plurality of thin ferromagnetic layers and associated current and voltage contacts, respectively, for passing an electric current through the layers and reading a voltage drop from said layers representing an external magnetic field in the region of the sensor. The sensor is intended, above all, for reading magnetically stored data, although it can be used for any application where magnetic fields have to be measured with high spatial resolution.

BACKGROUND OF THE INVENTION

A magnetic sensor utilizing a thin magnetic film traversed by an electric current I and across which a voltage drop can be detected is known and utilizes the magnetic resistance effect. According to this principle, when the thin magnetic film traversed by a current I is juxtaposed with a source of a magnetic field, the external magnetic field alters the electrical resistance of the film by the magnetic resistance effect and this resistance change, because of the passage of an electric current through the film can be manifested in a change in the voltage which is detected. The voltage thus represents the external magnetic field. The terminal through which the electric current is applied can be considered means for connecting an electric current source to the film while the terminals across which the voltage is detected can be considered means connected across the film for measuring the potential difference thereacross.

The sensors of this type can be used for reading magnetically stored data, for example solid plate magnetic storage and so-called hard disks, floppy disks, magnetic tape and other storage sources. They may be used for any other purpose in which high resolution in the detection of local magnetic fields is necessary and desirable.

In such applications, the magnetic fields emanating from the data storage medium are converted into changes in the magnetization direction or domain structure in the magnetic layers of the magnetic field sensor. In detectors used heretofore, because of the so-called anisotropic magnetic resistance effect, there is a change in the electrical resistance and thus a potential difference U which is a detectable electrical signal. The thus obtained electrical signal can be processed by conventional circuitry.

With certain films, for example Permalloy, the change in magnetic resistance upon which the measurement signal depends, is a maximum of about 3%. The signal level is thus small and since the value of the signal depends upon the signal/noise ratio, it is highly desirable to maximize the output signal U.

OBJECTS OF THE INVENTION

It is thus an object of the present invention to provide a magnetic field sensor in which the change magnetic resistance and hence the measurement signal is greater than that which can be obtained with earlier known magnetic field sensores.

Another object of the present invention is to increase the signal/noise ratio of a magnetic field sensor utilizing thin ferromagnetic films.

SUMMARY OF THE INVENTION

These objects and others which will become more apparent hereinafter are attained, in accordance with the present invention, in a magnetic field sensor which comprises:

a sensor element having a stack of at least three layers including:

a first ferromagnetic layers magnetized in a first direction, an intermediate layer of a nonferromagnetic material forming an interface with the first layer, and a second ferromagnetic layer forming an interface with the intermediate layer and magnetically polarized with one component in a direction opposite to the first direction so that the first and second layers are magnetized so that one component has a magnetization direction opposite to that of the other, the intermediate layer of appropiate material increasing the electrical resistance across the sensor caused by the opposite direction of magnetization of the first and second layers, the intermediate layer having a thickness less than the mean free path of the conducitivity electrons, means for connecting an electric current source across the sensor to pass an electrical current therethrough; and means connected across the sensor for measuring a potential difference thereacross representing an external magnetic field acting upon the sensor.

In the above context, the intermediate layer provides an increased electrical resistance in conjunction with the anti-parallel or directionally opposite magnetization of the ferromagnetic layers which can increase the measurement signal compared to the anisotropic effect mentioned above by at least a factor of three, i.e. at least three times.

The invention makes use of the fact that a change in the resistance generating the measurement signal is a result, of the scattering of conductivity band electrons, also referred to herein as conduction or conductivity electrons.

In layered magnetic structures as described the scattering of electrons and thus electrical resistivity can increase due to the antiparallel alignment. The effect is understood to be due to the different scattering rates of electrons which have their spin orientation parallel and antiparallel to the magnetization. This spin orientation dependent electron scattering is known from bulk magnetic materials containing nonmagnetic impurities (see: J.W.F. Dorleijn, Philips Res. Repts. 31, 287, 1976, and I.A. Campbell and A. Fert in "Ferromagnetic materials", vol. 3 ed. by E.P. Wohlfarth, North Holland Publ. Comp. 1982). Here the scattering of the electrons at the impurities has different strength for the two spin orientations. Numerical values for different magnetic and impurity materials are available in the published literature (see the references cited above). In layered structures the nonmagnetic interlayers play the same role as the impurities in the case of the bulk materials. The scattering occurs at the interfaces. Therefore in order to choose proper interlayer materials the information from the quoted literature can be used.

In the layered structures in addition it is possible to change the magnetization direction between neighbouring magnetic layers. Suppose now one chooses for the interlayer material one with a large difference in the scattering rates for electrons with the two spin orientations. If the ferromagnetic layers are magnetically parallel only electrons with one spin orientation are strongly scattered. In the antiparallel (oppositely magnetized) aligned state both are strongly scattered, and the resistivity increases. Hence by changing the angle $\phi$ between the magnetization from the parallel to the antiparallel aligned state the resitivity increases and the invention exploits this effect in a field sensor. One essential feature of such a sensor therefore is to have neighboring ferromagnetic layers at least partly, i.e. in one component, in antiparallel alignment. During operation the magnetizations then include a finite angle $\phi$, e.g. $\phi \approx 90°$, which varies due to variations in the signal magnetic field $H_S$. Variations in $\phi$ then generate variations in the electrical resistivity via the new magnetoresistance effect and this is the way, $H_S$ is detected.

Since it is known that the mentioned alignment can also be used for noise reduction it has already been investigated and means to achieve it belong to the state of the art. For the methods described so far the interlayers are made sufficiently thick, so that the ferromagnetic layers are magnetically decoupled. In order to obtain in these cases also the new magneto-resistance effect I use for these structures particular materials as described below and which can be used in conjunction with the described methods to obtain the desired alignment. Generally, one can use combinations of materials which yield a strong dependence of the electron scattering on the spin orientation. As mentioned information on this is available in the quoted literature.

The invention also is a new method to obtain the canted alignment which relies on antiferromagnetic type interlayer exchange. It will be described below and I will also set forth appropriate materials which simultaneously yield antiferromagnetic interlayer exchange and produce the new magneto-resistance effect.

Starting from antiparallel alignment ($\phi=180°$) perpendicular to the direction of the signal field $H_S$, proper canting of the magnetization during operation can be obtained e.g. by superimposing $H_S$ with a proper bias field $H_b^2$ until the change in resistivity due to change in $H_S$ is at an optimum. If the change in resistivity is large enough a $\phi=180°$, no bias field $H_b^2$ is required. I shall describe below methods of obtaining the antiparallel alignment. In these cases it is understood that during operation it is possible to apply a bias field $H_b^2$. In addition another bias field, $H_b^1$, might be necessary to obtain the antiparallel alignment before operation. Here it is assumed that $H_b^1$ is aligned parallel to the plane of the film, perpendicular to the direction of $H_S$.

In a first embodiment of the invention the two ferromagnetic films have sufficiently different coercive fields $H_c$ and the interlayer is thick enough so that the two ferromagnetic films are magnetically decoupled. In this case antiparallel alignment can be obtained by application of a bias field $H_b^1$. For example the ferromagnetic films can first be aligned parallel by a sufficiently large $H_b^1$. In a next step $H_b^1$ is applied opposite to the previous direction and with such strength that only the ferromagnetic film with the lower $H_c$ reverses in magnetization, whereas the other is unchanged. As a result the two ferrromagnetic films are aligned antiparallel.

To obtain different values of $H_c$ a wide range of possibilities is available. $H_c$ can be modified e.g. by proper doping with other materials, e.g. Ru, Mn, Zr, B by the growth conditions and by choice of the substrates to name only a few possibilities. One can also simply use different materials for the ferromagnetic layers, like permalloy for the one an Fe for the other. The thickness of the interlayer has to be large enough to provide magnetic decoupling but still small enough to be below the mean free path length of the conduction electrons. A thickness around 5 nm (50 Å) will generally be a good compromise. The interlayer material has to be chosen such that increased electron scattering due to antiparallel alignment occurs, It is also important to have enough roughness at the interfaces between the ferromagnetic films and the interlayer to provide enough scattering centers. This can be achieved by using the proper growth conditions.

A second possibility for antiparallel alignment relies on the fact that in this situation the magnetostatic energy is at a minimum. At the edges of the films there is then flux closure and the stray field outside the films is greatly reduced. Since the energy gain is only small it is important in this case to have very soft magnetic material for the ferromagnetic films. $H_c$ has to be small. The interlayer has to be thick enough so there is no magnetic coupling (except as mentioned at the edges). If $H_c$ of both films is small enough the magnetizations can move freely anf the system drops into the energy minimum corresponding to the antiparallel aligned state. A sensor with these characteristics could be made of the soft magnetic permalloy (supermalloy) films interspaced by e.g. Ru of 4–6 nm thickness. During fabrication of the films an external magnetic field should be applied in the plane of the film to introduce the wellknown magnetic field induced uniaxial anisotropy. For small enough external fields in such a sensor the magnetizations of the two permalloy films will align antiparallel along the magnetic field induced easy-magnetization axis.

A third possibility of obtaining antiparallel alignment is via the "exchange anisotropy effect". The conditions are very similar to the situation described in the first embodiment. The difference is that here the ferromagnetic films can have the same $H_c$ but the hysteresis curve of one film is shifted by the presence of an antiferromagntic layer adjacent to it. This is the well known exchange anisotropy effect. With respect to the interlayer material and its thickness and the interface roughness the same criteria apply as described above. A sensor which would have these characteristics could for example be made of two permalloy films interspaced by 5 nm of Ru and having a film of antiferromagnetic MnFe adjacent to one of the two permalloy films.

In a last embodiment of the sensor proposed here the antiparallel alignment is obtained through antiferromagnetic type interlayer exchange coupling. This type of coupling has been shown to exist for ferromagnetic films across Cr and Y interlayers of proper thickness. The coupling is strongest for interlayer thicknesses between 0.6 and 1.2 nm but for a sensor it may be desirable to choose also other thicknesses in order to tailor the strength of the coupling. A sensor having these characteristic should be made of Fe-films each between 10 nm and 40 nm thick interspaced by Cr films of thickness between 0.8 and 2 nm. A Cr layer of this kind not only ensures that there is antiparallel alignment but provides also the desired magnetoresistance effect. The strength of the antiferromagnetic coupling and of the magnetoresistance effect can be tailored via the thickness of the Cr-film and by doping the Cr with appropriate materials, e.g. Au. One can also introduce additional layers, e.g. of Au, between the Fe-films and the Cr-interlayer.

It will be understood that the various types of techniques used to accomplish the antiparallel magnetization directions can be combined.

BRIEF DESCRIPTION OF THE DRAWING

The above objects, features and advantages of my invention will become more readily apparent from the following description, reference being made to the accompanying drawing in which.

SPECIFIC DESCRIPTION

Figure 1:
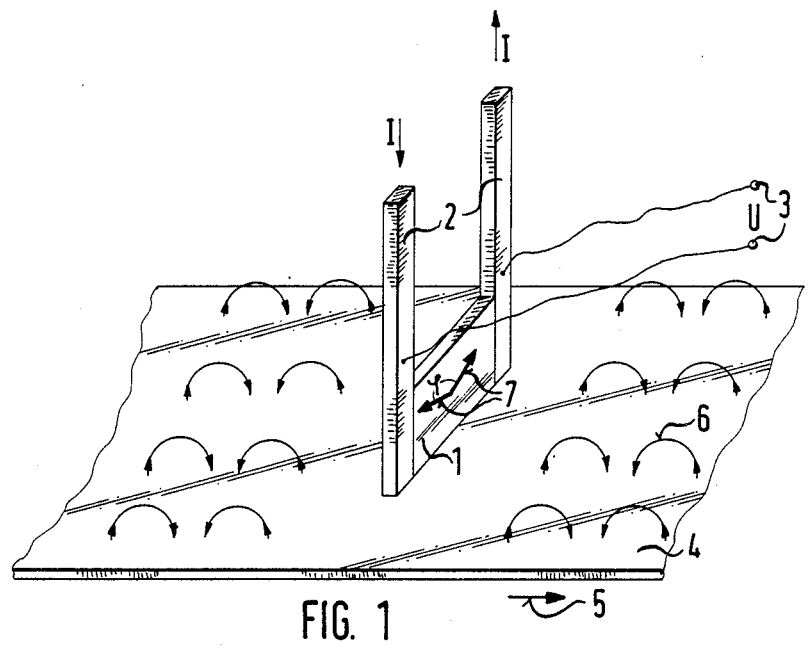
FIG. 1 is an illustration of a magnetic field sensor of the invention used in conjunction with a magnetic data carrier in a perspective view.
Figure 3:
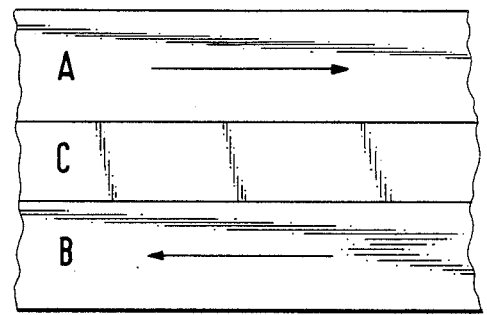
FIG. 3 is a diagram illustrating in cross section the relationship between two ferromagnetic layers (A,B) interspaced by a non ferromagnetic one (C)
Figure 4:
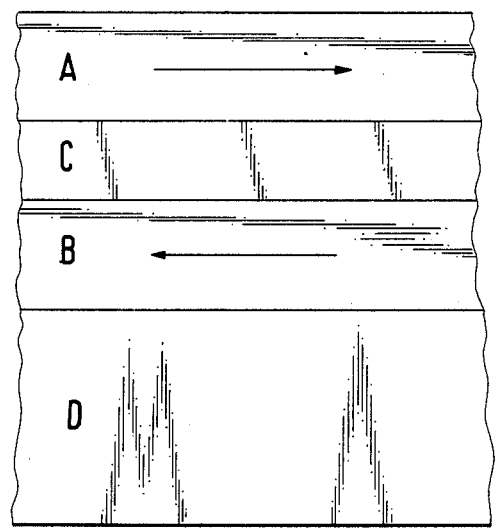
FIG. 4 is a view similar to FIG. 3 including a further layer (D) of antiferromagnetic material.

The magnetic field sensor shown in FIG. 1 comprises a thin layer 1 which can represent, when used in conjuction with the stacks of FIGS. 3 and 4, for example, either of these stacks, having current contacts or terminals 2 for passing the electric current I through the sensor and voltage contacts or terminals 3 for tapping the measurement voltage U therefrom for signal pick-up. Data carrier 4 moves in the direction of arrow 5.

The magnetic fields of the data carrier are represented by the curved arrows 6 and the magnetization directions in the sensor turned toward the viewer are represented by the arrows 7 in FIG. 1. In order to distinguish between the magnetizations of the two ferromagnetic films they are indicated by a solid and an open arrow. In one direction they have antiparallel components. In FIG. 1 this is the direction parallel to the plane of the data carrier but it could also be some other direction. If the magnetic fields of the data carrier penetrate the sensor, the electrical resistance is changed by the fact that the angle $\phi$ between the magnetizations changes. This produces the voltage signal U which can b e processed, e.g. amplified and detected by a threshold detector to signal the magnetic field direction and/or presence or absence of the magnetic field at a particular location to read the data stored.

Figure 2:
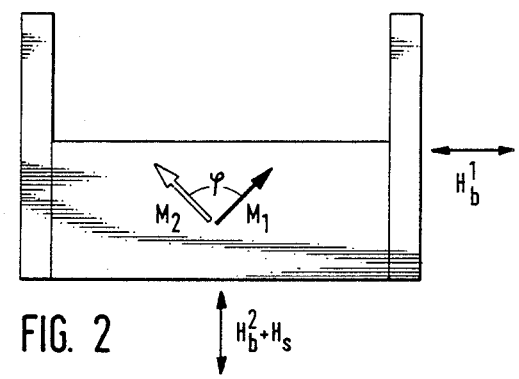
FIG. 2 is a front view of the sensor wherein $M_1$ and $M_2$ indicate the magnetization directions of two ferromagnetic films, inclined with respect to each other including an angle $\phi$. $H_b^1$ and $H_b^2$ denote bias fields, $H_s$ is the signal field.

FIG. 2 shows a front view of the sensor of FIG. 1 to give a better idea of the magnetization directions and orientations of bias and measuring fields, $H_b^1$ is a bias field as described above to obtain antiparallel alignment. $H_b^2$ is a bias field to control the optimum tilt angle $\phi$ between the magnetizations $M_1$, $M_2$ of the two ferromagnetic films. $H_s$ is the field to be detected.

The stack shown in FIG. 3 has the antiparallel magnetization effect generated in either of three different ways. If the material of layer A is, for example, Fe, the material of layer B is permalloy and the material of layer C is Au, with a thickness above 5 nm the layers A and B will be decoupled through the nonmagnetic layer C, but upon the application of an external magnetic field $H_b^1$, because of the difference in coercive field strengths, $H_c$, the layers A and B will have antiparallel orientations.

If the material of layer A is, for example, Fe, the material of layer B is also Fe or of Permalloy and the intermediate layer C is composed of Cr with a thickness of $\approx 1$ nm, the antiparallel magnetization will result from antiferromagnetic coupling. If both layers are of soft magnetic permalloy, antiparallel alignment can also be the result of dipolar coupling via the stray fields emanating at the edges of the films because this minimizes the magnetostatic energy.

FIG. 4 shows the stack in which a further layer D of antiferromagnetic material, for example MnFe is provided. The material of layers A and B can be Permalloy and layer C can be composed of Au in a thickness of about 5 nm. In this case, the hysteresis curve of layer B is shifted while that of layer A is not shifted. By a remagnetization of layer A for a given external magnetic field $H_b^1$ antiparallel magnetization of the ferromagnetic layers will result.

I claim:

1. A magnetic-field sensor, comprising:
   a sensor element having a stack of at least three layers including:
   a first ferromagnetic layer magnetized in a first direction,
   an intermediate layer of a nonferromagnetic material forming an interface with said first layer, and
   a second ferromagnetic layer forming an interface with said intermediate layer and magnetically polarized with one magnetization-direction component in a direction opposite to said first direction so that said first and second layers are polarized with one component magnetically antiparallel to said first direction, said intermediate layer being composed of a material which causes a spin dependent electron scattering at the interfaces with the ferromagnetic layers, said intermediate layer having a thickness less than the mean free path length of conductivity electrons in said intermediate layer;
   means for connecting an electric current source across the sensor element to pass an electrical current therethrough; and
   means connected across the sensor element for measuring a potential difference thereacross representing an external magnetic field acting upon said stack.

2. The magnetic-field sensor defined in claim 1 wherein the ferromagnetic layers of said stack are composed of materials having different coercive field strengths $H_c$.

3. The magnetic-field sensor defined in claim 2 wherein said materials are of alloys of Fe, Co, Ni doped to tailor the coercive field strength Hc.

4. The magnetic field sensor described in claim 1 where both ferromagnetic layers are composed of soft magnetic permalloy.

5. The magnetic-field sensor defined in claim 1 wherein said stack comprises a further layer in contact with one of said ferromagnetic layers and is composed of an antiferromagnetic material.

6. The magnetic-field sensor defined in claim 5 wherein siad ferromagnetic layers are composed of soft magnetic transition metal alloy.

7. The magnetic-field sensor defined in claims 2, 3, 4, 5 or 6 wherein said intermediate layer has a thickness of substantially 1 to 10 nm and is composed of a material selected from the group which consists of Au, Cr, V and Ru.

8. The magnetic-field sensor defined in claim 5 wherein said further layer is composed of MnFe.

9. The magnetic-field sensor defined in claim 1 wherein both of said ferromagnetic layers are composed of a material selected from the group which consists of Fe, Co, Ni and alloys thereof and said intermediate layer is composed fo a material enabling antiferromagnetic coupling of said first and second layers to effect antiparallel magnetization thereof.

10. The magnetic-field sensor defined in claim 9 wherein said intermediate layer is composed of a material selected from the group which consists of Cr and Y.

11. The magnetic-field sensor defined in claim 9 wherein said intermediate layer has a thickness of 0.3 to 2 nm.

12. A multilayer stack constructed by repetition or combination of units as described in claim 1.

* * * * *